United States Patent
Yu et al.

(10) Patent No.: US 9,978,680 B2
(45) Date of Patent: May 22, 2018

(54) SEMICONDUCTOR DEVICE AND METHOD

(71) Applicant: Taiwan Semiconductor Manufacturing Company, Ltd., Hsinchu (TW)

(72) Inventors: Dian-Sheg Yu, Hsinchu (TW); Ren-Fen Tsui, Yungho (TW); Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 15/608,315

(22) Filed: May 30, 2017

(65) Prior Publication Data
US 2017/0263555 A1 Sep. 14, 2017

Related U.S. Application Data

(63) Continuation of application No. 15/170,207, filed on Jun. 1, 2016, now Pat. No. 9,666,587.

(60) Provisional application No. 62/288,799, filed on Jan. 29, 2016.

(51) Int. Cl.
*H01L 29/00* (2006.01)
*H01L 23/525* (2006.01)
*H01L 27/06* (2006.01)
*H01L 21/8234* (2006.01)

(52) U.S. Cl.
CPC ...... *H01L 23/5256* (2013.01); *H01L 21/8234* (2013.01); *H01L 27/0617* (2013.01)

(58) Field of Classification Search
CPC ............. H01L 23/5256; H01L 21/8234; H01L 27/0617
USPC ........................................................ 257/529
See application file for complete search history.

(56) References Cited

U.S. PATENT DOCUMENTS

| | | | |
|---|---|---|---|
| 6,704,235 B2 | 3/2004 | Knall et al. | |
| 6,849,905 B2 * | 2/2005 | Ilkbahar ................ | H01L 29/792 257/390 |
| 6,965,137 B2 | 11/2005 | Kinney et al. | |
| 8,027,215 B2 * | 9/2011 | Lambertson ............ | G11C 11/36 365/163 |
| 8,045,364 B2 | 10/2011 | Schloss et al. | |
| 8,331,185 B2 * | 12/2012 | Obayashi ............. | G11C 17/165 365/189.16 |
| 2007/0284578 A1 * | 12/2007 | Yoon ..................... | G02F 1/1362 257/48 |
| 2015/0146471 A1 * | 5/2015 | Kim .................... | H01L 23/5252 365/96 |

* cited by examiner

Primary Examiner — Luan C Thai
(74) Attorney, Agent, or Firm — Slater Matsil, LLP

(57) ABSTRACT

A structure and method for the formation and use of fuses within a semiconductor device is provided. The fuses may be formed within the third metal layer and are formed so as to be arranged perpendicularly to active devices located on an underlying semiconductor substrate. Additionally, the fuses within the third metal layer may be formed thicker than an underlying second metal layer.

20 Claims, 10 Drawing Sheets

SEMICONDUCTOR DEVICE AND METHOD

PRIORITY CLAIM AND CROSS-REFERENCE

This application is a continuation of U.S. patent application Ser. No. 15/170,207 filed on Jun. 1, 2016, entitled "Semiconductor Device and Method," which application claims priority to and the benefit of U.S. Provisional Application No. 62/288,799, filed on Jan. 29, 2016, entitled "EFuse Area Reduction and Fuse Connection Current Increasing," which application is hereby incorporated herein by reference in its entirety.

BACKGROUND

As semiconductor devices decrease in size, each individual component within the semiconductor device should also be reduced in size or it risks becoming a bottleneck for the further reduction of the device as a whole. For example, as the size of transistors or active devices are reduced, the other parts of the semiconductor device, such as the dielectric layers and metallization layers that provide the interconnectivity for the active devices, should also see a reduction in size. Otherwise, the overall size of the device may remain the same.

However, reducing the dielectric and metallization layers presents its own set of problems. For example, as the metallization layers themselves are scaled down, any devices formed within the metallization layers, such as passive devices including capacitors, resistors, fuses, etc., would also be scaled down. However, scaling down these types of devices may modify their characteristics beyond a desired range of performance. As such, new methods of forming and using the metallization layers and devices within the metallization layers are desired in order to increase the miniaturization of these components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
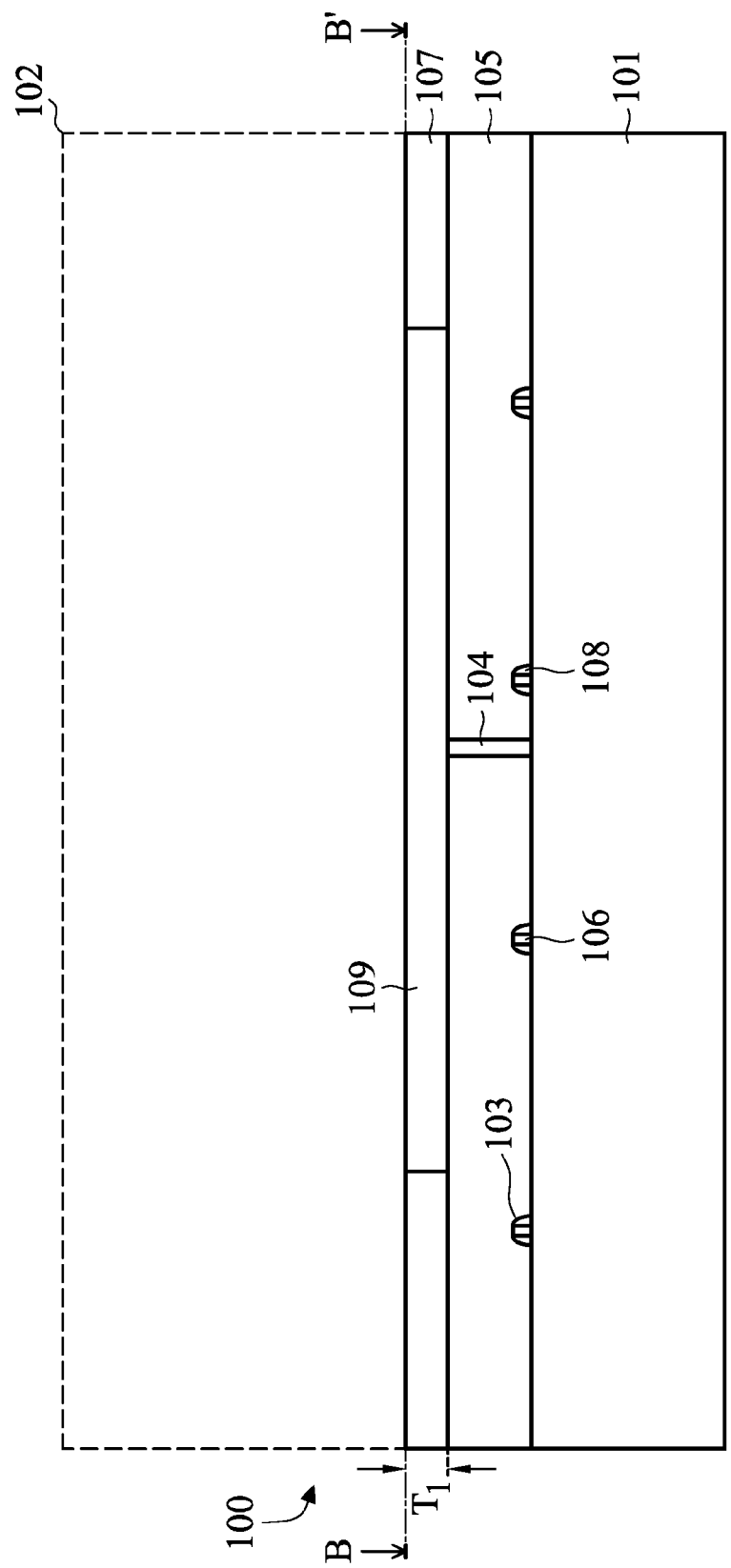
FIGS. 1A-1B illustrate a formation of active devices and a first metal layer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
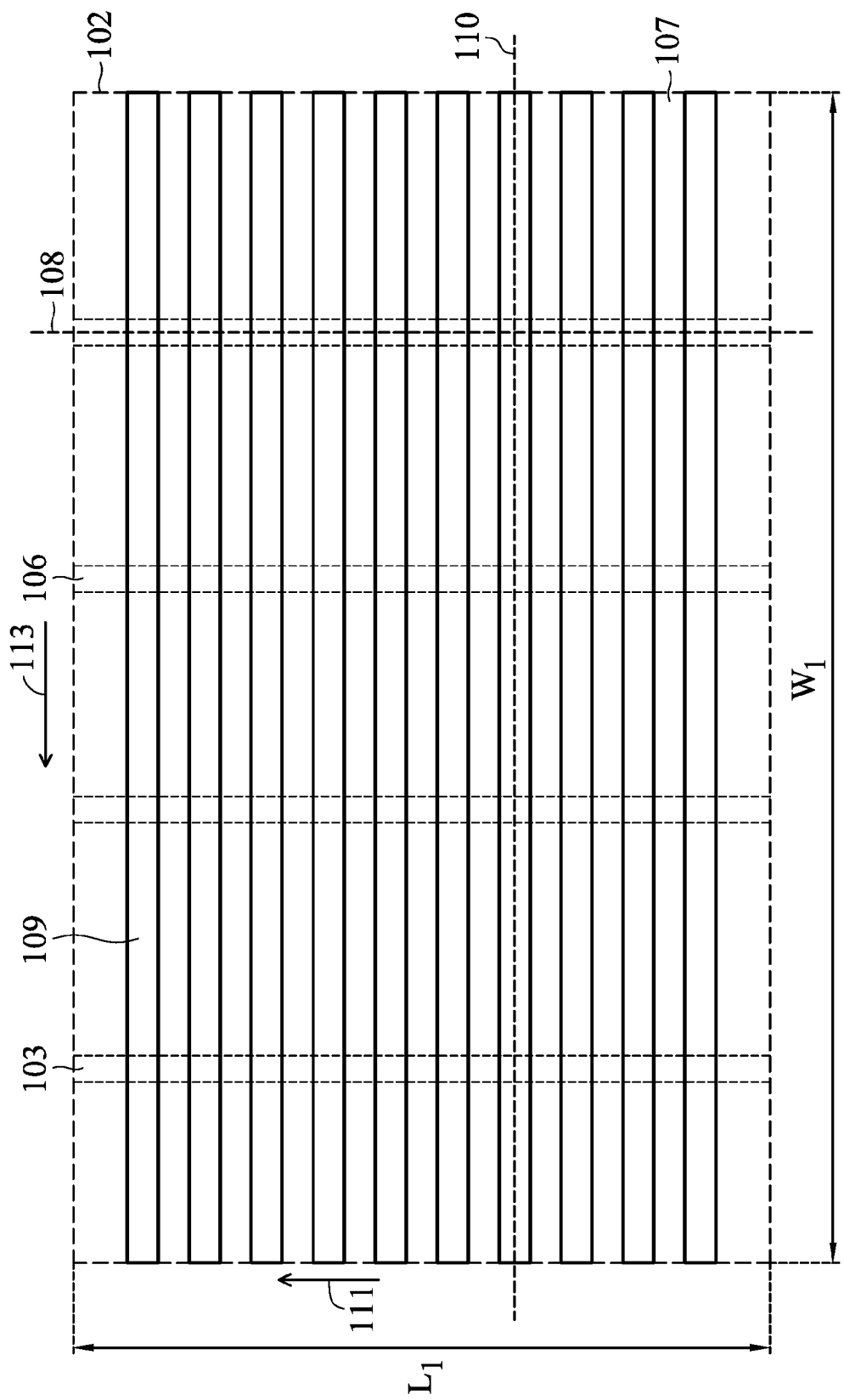

With reference now to FIGS. 1A-1B, wherein FIG. 1B illustrates a top down view of FIGS. 1A along line B-B' in FIG. 1A, there is shown a portion of a semiconductor device 100 including a semiconductor substrate 101, active devices 103, an interlayer dielectric (ILD) 105, a first dielectric layer 107, and a first metal layer 109 (M1) within the first dielectric layer 107. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The semiconductor substrate 101 may include active devices 103. As one of ordinary skill in the art will recognize, a wide variety of active devices and passive devices such as transistors, capacitors, resistors, combinations of these, and the like may be used to generate the desired structural and functional requirements of the design for the semiconductor device 100. The active devices 103 may be formed using any suitable methods.

In one particular embodiment, the active devices 103 may comprise a gate dielectric (not separately illustrated in FIG. 1A), a gate electrode 106, and spacers 108 overlying a channel region (not separately illustrated in FIG. 1A) with source/drain regions (also not separately illustrated in FIG. 1A) on either side of the gate electrode 106. The gate dielectric and the gate electrode 106 may be formed and patterned on the semiconductor substrate 101 by any suitable process known in the art. The gate dielectric may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. Preferably, the gate dielectric has a relative permittivity value greater than about 4.

In an embodiment in which the gate dielectric comprises an oxide layer, the gate dielectric may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In one embodiment, the gate dielectric is between about 8 Å to about 50 Å in thickness, such as about 16 Å in thickness.

The gate electrode 106 comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrode 106 is poly-silicon, the gate electrode 106 may be formed by depositing doped or undoped poly-silicon by low-pressure chemical vapor deposition (LPCVD) to a thickness in the range of about 100 Å to about 2,500 Å, such as about 1,500 Å.

The spacers 108 are formed on sidewalls of the gate dielectric and the gate electrode 106. The spacers 108 are typically formed by blanket depositing a spacer layer (not shown) on the previously formed structure. The spacer layer comprises SiN, oxynitride, SiC, SiON, oxide, and the like, and is formed by commonly used methods such as chemical vapor deposition (CVD), plasma enhanced CVD, sputter, and other methods known in the art. The spacer layer is then patterned to form the spacers 108, such as by anisotropically etching to remove the spacer layer from the horizontal surfaces of the structure.

Source/drain regions are formed in the semiconductor substrate 101 on opposing sides of the gate dielectric. In an embodiment in which the semiconductor substrate 101 is an n-type substrate, the source/drain regions are formed by implanting appropriate p-type dopants such as boron, gallium, indium, or the like. Alternatively, in an embodiment in which the semiconductor substrate is a p-type substrate, the source/drain regions may be formed by implanting appropriate n-type dopants such as phosphorous, arsenic, or the like. These source/drain regions are implanted using the gate dielectric, gate electrode 106 and the spacers 108 as masks.

It should be noted that one of ordinary skill in the art will realize that many other processes, steps, or the like may be used to form these source/drain regions. For example, one of ordinary skill in the art will realize that a plurality of implants may be performed using various combinations of spacers and liners to form source/drain regions having a specific shape or characteristic suitable for a particular purpose. Any of these processes may be used to form the source/drain regions, and the above description is not meant to limit the present embodiments to the steps presented above.

Looking at FIG. 1B, in an embodiment the gate electrode 106 of each of the active devices 103 within a first area (represented in FIG. 1B by the dashed box labeled 102) may be formed so as to extend in the same direction as each other, and in one particular embodiment the first area 102 may be a fuse bit cell area. In an embodiment the first area 102 may be a region of the semiconductor substrate 101 that will have fuses formed within a third metal layer 301 (not illustrated in FIG. 1B but illustrated and discussed below with respect to FIG. 3). As such, while the first area 102 may include the entire semiconductor substrate 101, the first area 102 may also include a subsection of the semiconductor substrate 101, such as a region with a first width $W_1$ of between about 200 μm and about 400 μm, such as about 300 μm, and a first length $L_1$ of between about 100 μm and about 300 μm, such as about 200 μm. However, any suitable dimensions may be utilized.

Additionally in the top down view of FIG. 1B, there are located within the first area 102 at least some of the active devices 103. The active devices 103 that are located within the first area 102 (in this top down view) each have a gate electrode 106 with a first longitudinal axis (represented in FIG. 1B by the dashed line labeled 108) that is parallel with the other gate electrodes 106 within the first area 102. Further, the first longitudinal axis of each gate electrode 106 within the first area 102 extends along a first direction (represented in FIG. 1B by the arrow labeled 111).

Referring back to FIG. 1A, the ILD layer 105 is formed over the active devices 103 in order to protect and isolate the active devices 103. In an embodiment the ILD layer 105 may comprise a material such as boron phosphorous silicate glass (BPSG), although any suitable dielectrics may be used for either layer. The ILD layer 105 may be formed using a process such as PECVD, although other processes, such as LPCVD, may alternatively be used. The ILD layer 105 may be formed to a thickness of between about 100 Å and about 3,000 Å.

Once the ILD layer 105 has been formed, contact plugs 104 may be formed through the ILD layer 105 to electrically connect the active devices 103 with the overlying first metal layer 109. In an embodiment the formation of the contact plugs 104 may be initiated by first forming contact plug openings through the ILD layer 105 to expose either the source/drain regions or else the gate electrodes 106 of the active devices 103. In an embodiment the contact plug openings may be formed using a suitable photolithographic masking and etching process.

Once the contact plug openings have been formed, a formation of a first glue layer (not separately illustrated in FIG. 1A) may be initiated. In an embodiment the first glue layer is utilized to help adhere the rest of the contact plugs 104 to the underlying structure and may be, e.g., tungsten, titanium nitride, tantalum nitride, or the like formed using a process such as CVD, plasma enhanced chemical vapor deposition (PECVD), physical vapor deposition (PVD), atomic layer deposition (ALD), and the like or the like.

Once the first glue layer has been formed, the remainder of the contact plugs 104 are formed in contact with the glue layer. In an embodiment the material of the contact plugs 104 is tungsten (W), although any other suitable material, such as aluminum, copper, combinations of these, or the like, may alternatively be utilized. The material of the contact plugs 104 may be formed using a process such as CVD, although any suitable process, such as PECVD, physical vapor deposition (PVD), atomic layer deposition (ALD), and the like, may alternatively be utilized.

Once filled, a planarization of the contact plugs 104 is performed such that the material of the contact plugs 104 that is outside of the ILD layer 105 is removed, forming the contact plugs 104 (one of which is illustrated in FIG. 1A). In an embodiment the planarization process is a chemical mechanical polish (CMP), in which a combination of etching materials and abrading materials are put into contact with the material of the contact plugs 104 and a grinding pad (not separately illustrated) is used to grind away the material of the contact plugs 104 until all of the material of the contact plugs 104 over the first dielectric layer 105 has been removed.

The first dielectric layer 107 may be formed over the ILD layer 105. The first dielectric layer 107 may be made of one or more suitable dielectric materials such as low-k dielectrics such as carbon doped oxides, extremely low-k dielectrics such as porous carbon doped silicon dioxide, silicon oxide, silicon nitride, a polymer such as polyimide, combinations of these, or the like. The first dielectric layer 107 may be formed through a process such as a spin-on process or a chemical vapor deposition (CVD), although any suitable process may be utilized, and may have a first thickness $T_1$ of between about 400 Å and about 1000 Å, such as about 600 Å.

FIGS. 1A-1B additionally illustrate a formation of the first metal layer 109 within the first dielectric layer 107. In an embodiment the first metal layer 109 may be formed using, e.g., a damascene process, whereby an opening is first formed within the first dielectric layer 107. In an embodiment the opening may be formed by first placing and patterning a photoresist material over the first dielectric layer 107. Once the photoresist material has been placed and patterned, a dry etch process such as a reactive ion etch may be utilized to transfer the pattern from the patterned photoresist to the underlying first dielectric layer 107.

Once the desired pattern has been transferred, the opening may be filled with a conductive material in order to form the first metal layer 109 within the first dielectric layer 107. In an embodiment the formation of the conductive material may be initiated by first depositing a barrier layer (not separately illustrated in FIGS. 1A-1B). The barrier layer may be a barrier material such as titanium nitride or tantalum nitride which may be deposited using a deposition process such as chemical vapor deposition, physical vapor deposition, atomic layer deposition, or the like. However, any suitable material or method of deposition may be utilized to form the barrier layer.

Once the barrier layer has been formed, a conductive material may be deposited to fill and/or overfill the openings within the first dielectric layer 107. In an embodiment the conductive material may be a material such as copper, aluminum, or tungsten, formed, e.g., using a seed layer (not shown) and a plating process, such as electrochemical plating, although other processes of formation, such as sputtering, evaporation, or a PECVD process, may alternatively be used depending upon the desired materials. Once the openings for the first metal layer 109 have been filled with conductive material, any excess conductive material outside of the openings for the first metal layer 109 may be removed, and the first metal layer 109 and the first dielectric layer 107 may be planarized using, for example, a chemical mechanical polishing process. Additionally, because all of the excess conductive material is removed from outside of the openings, the first metal layer 109 will also have the same thickness as the first dielectric layer 107, such as by having the first thickness $T_1$.

Looking back at FIG. 1B, the first metal layer 109 is utilized to interconnect the various active devices 103 (through the contact plugs 104) and routes the connections as desired in order to form the functional requirements for the semiconductor device 100. Additionally, each of the individual conductive lines within the first metal layer 109 within the first area 102 has a second longitudinal axis (represented in FIG. 1B by the dashed line labeled 110) that is parallel with the other conductive lines within the first metal layer 109 within the first area 102. Additionally, the second longitudinal axis 110 run in a second direction (represented in FIG. 1B by the arrow labeled 113) that is perpendicular to the first direction 111. As such, the first metal layer 109 is aligned perpendicular with the gate electrodes 106 of the active devices 103.

Figure 2A:
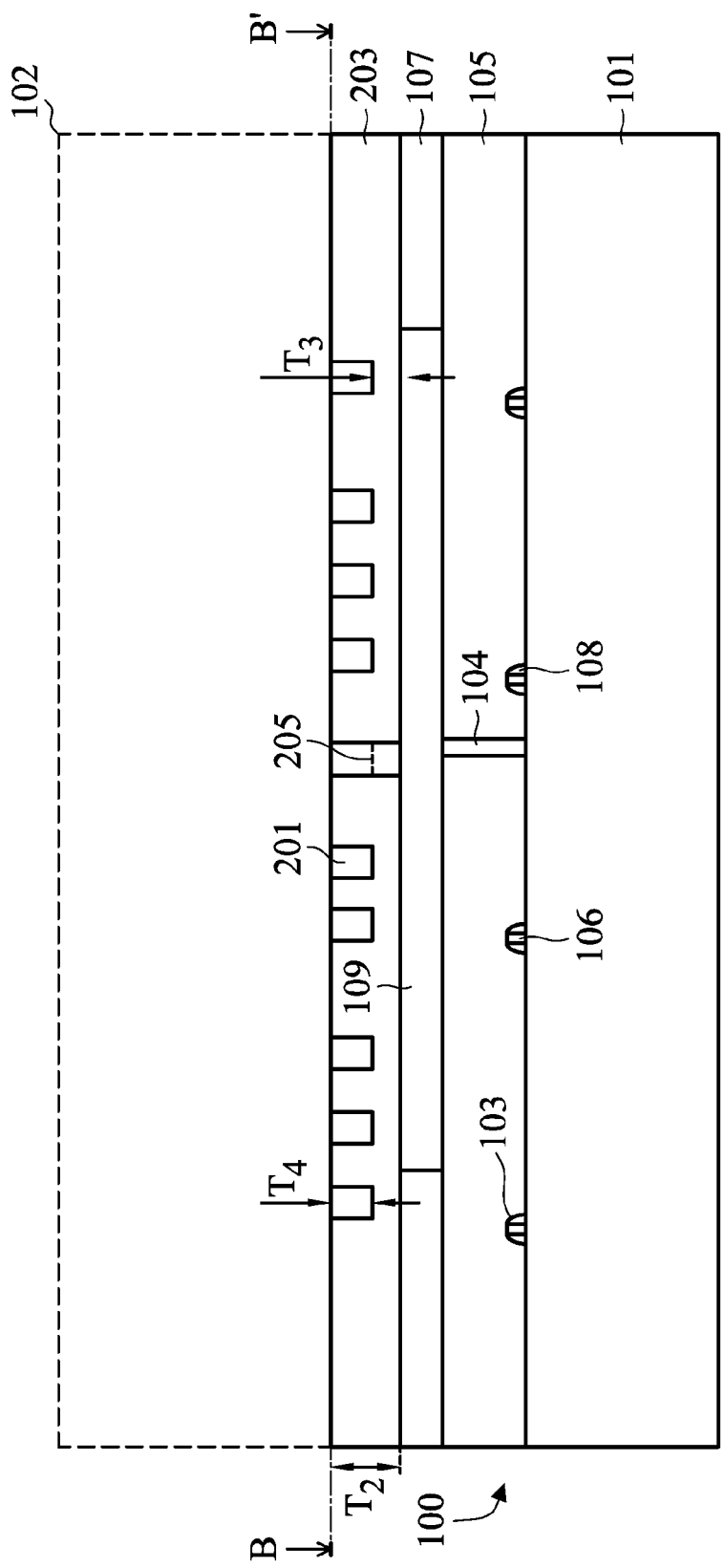
FIGS. 2A-2B illustrate a formation of a second metal layer in accordance with some embodiments.
Figure 2B:
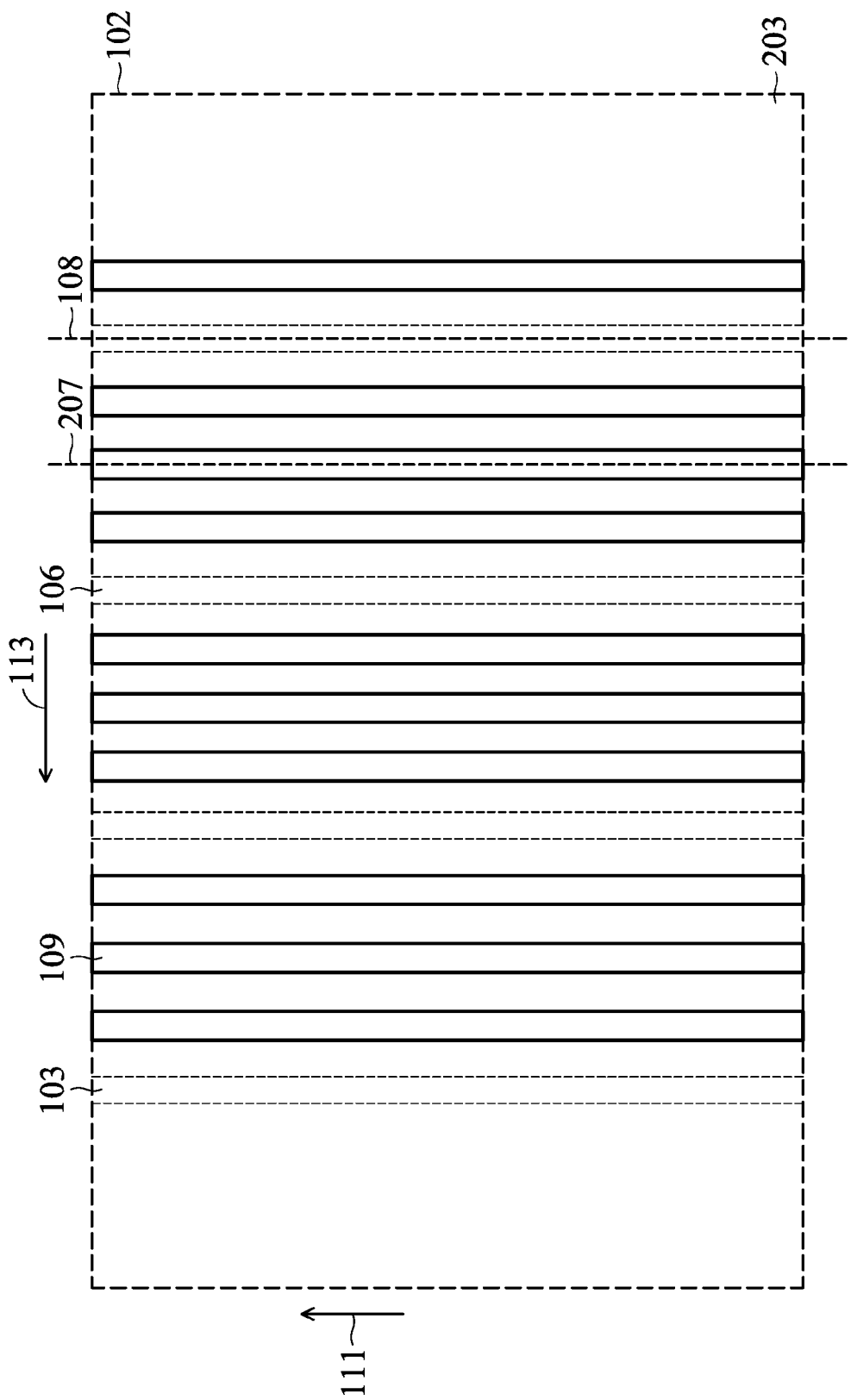

FIGS. 2A-2B illustrate a cross-sectional view and a top down view, respectively, with FIG. 2B illustrating a top down view of FIG. 2A along line B-B', of the semiconductor device 100 after the formation of a second metal layer 201 (M2) within a second dielectric layer 203. In an embodiment the second dielectric layer 203 may be initially formed prior to the second metal layer 201, and the second dielectric layer 203 may be formed as discussed above with respect to the first dielectric layer 107. For example, the second dielectric layer 203 may be a low-k dielectric material formed using a spin on process. However, in this process the second dielectric layer 203 may be formed to have a second thickness $T_2$ of between about 1000 Å and about 2000 Å, such as about 1300 Å.

Once the second dielectric layer 201 has been formed, the second metal layer 201 may be formed within the second dielectric layer 203. In an embodiment the second metal layer 201 may be formed, e.g., by first forming openings for the second metal layer 201 into the second dielectric layer 203 using, e.g., a dual damascene process which utilizes two photolithographic masks and two etching processes to form both a lower via portion as well as an upper trench portion. In an embodiment the openings for the second metal layer 201 may be initiated using a first mask along with a first etching process in order to form the shape of the lower via portion of the second metal layer 201 (separated from the upper portion of the second metal layer 201 in FIG. 2A by the dashed line 205).

In an embodiment the first mask may be a photoresist that has been placed using, e.g., a spin on process. Once in place, the photoresist may then be exposed to a patterned light source and developed in order to form a patterned photoresist into the desired pattern for the lower via portion of the second metal layer 201. However, the first mask may alternatively be a hard mask such as silicon nitride. Any suitable masking material and any process of patterning the masking material may alternatively be utilized.

Once the first mask has been placed and patterned, the pattern of the first mask may be transferred to the second dielectric layer 203. In an embodiment a directional etching process such as a reactive ion etch may be utilized to remove the material of the second dielectric layer 203 while using the first mask as a mask during the etching. As such, only exposed and unprotected material is removed, thereby transferring the pattern of the first mask into the second dielectric layer 203.

Once the pattern of the first mask has been transferred to the second dielectric layer 203, the first mask may be removed. In an embodiment in which the first mask is a photoresist, the first mask may be removed using, e.g., an ashing process, whereby the temperature of the first mask is increased until a thermal decomposition occurs, whereby the photoresist may be removed. However, any other suitable method of removal, such as a wet etching process, may alternatively be utilized.

Once openings for the lower via portions of the second metal layer 201 have been shaped, the openings for the lower via portions may be extended at the same time as upper trench portions are formed within the second dielectric layer 203. In an embodiment, once the lower portions of the second metal layer 201 have been shaped by the first mask and etch, a second mask and a second etching process may be used to extend the openings for the second metal layer 201 to the first metal layer 109 as well as form the upper trench portion of the second metal layer 201 where the second metal layer 201 will be used to route the electrical signals, power, and ground connections.

The second mask may be similar to the first mask as discussed above. For example, the second mask may be a photoresist that has been patterned by exposing and developing a layer of photoresist composition (not individually illustrated) into the desired pattern for the upper trench portions of the second metal layer 201. However, the second mask may alternatively be a hard mask such as silicon nitride. Any suitable masking material and any process of patterning the masking material may alternatively be utilized.

Once the second mask has been placed and patterned, the pattern of the second mask may be transferred to the second dielectric layer 203. In an embodiment a directional etching process such as a reactive ion etch may be utilized to remove the material of the second dielectric layer 203 while using the second mask as a mask during the etching. As such, only exposed and unprotected material is removed, thereby transferring the pattern of the second mask into the second dielectric layer 203. This process forms the widened upper trench portions of the second metal layer 201 as well as extending the shape of the lower portions of the second metal layer 201 through the second dielectric layer 203 in order to expose the first metal layer 109.

Once finished, the second mask may be removed and the openings filled to form the second metal layer 201. In an embodiment in which the second mask is a photoresist, the second mask may be removed using, e.g., an ashing process, whereby a temperature of the material of the second mask is increased until the material of the second mask thermally decomposes and may be removed. However, any suitable removal process, such as etching or applying a suitable solvent, may alternatively be utilized.

After the second mask has been removed, the second metal layer 201 may be formed within both the lower via portion as well as the upper trench portion using a first seed layer (not shown) and a plating process, such as electrochemical plating, although other processes of formation, such as sputtering, evaporation, or PECVD process, may alternatively be used depending upon the desired materials. The second metal layer 201 may comprise copper, but other materials, such as aluminum or tungsten, may alternatively be used. Once the openings for the second metal layer 201 have been filled with conductive material, any excess conductive material outside of the openings for the second metal layer 201 may be removed, and the second metal layer 201 and the second dielectric layer 203 may be planarized using, for example, a chemical mechanical polishing process.

In an embodiment, the lower via portion of the second metal layer 201 may be formed to have a third thickness $T_3$ of between about 400 Å and about 800 Å, such as about 500 Å. Additionally, the upper via portion of the second metal layer 201 may be formed to have a fourth thickness $T_4$ that is greater than the first thickness $T_1$, such as being between about 600 Å and about 1200 Å, such as about 800 Å. However, any suitable thicknesses may be utilized to form the second metal layer 201.

FIG. 2B, which illustrates a top down view of the structure of FIG. 2A, illustrates that, within the first area 102 of the second metal layer 201, the individual lines of the second metal layer 201 (e.g., the upper trench portion) will have third longitudinal axes (represented in FIG. 2B by the dashed line labeled 207) that are parallel with each other. Further, these third longitudinal axes 207 are aligned in the first direction 111. As such, the individual lines of the second metal layer 201 are aligned in the same direction as the gate electrodes 106 of the active devices 103.

Figure 3A:
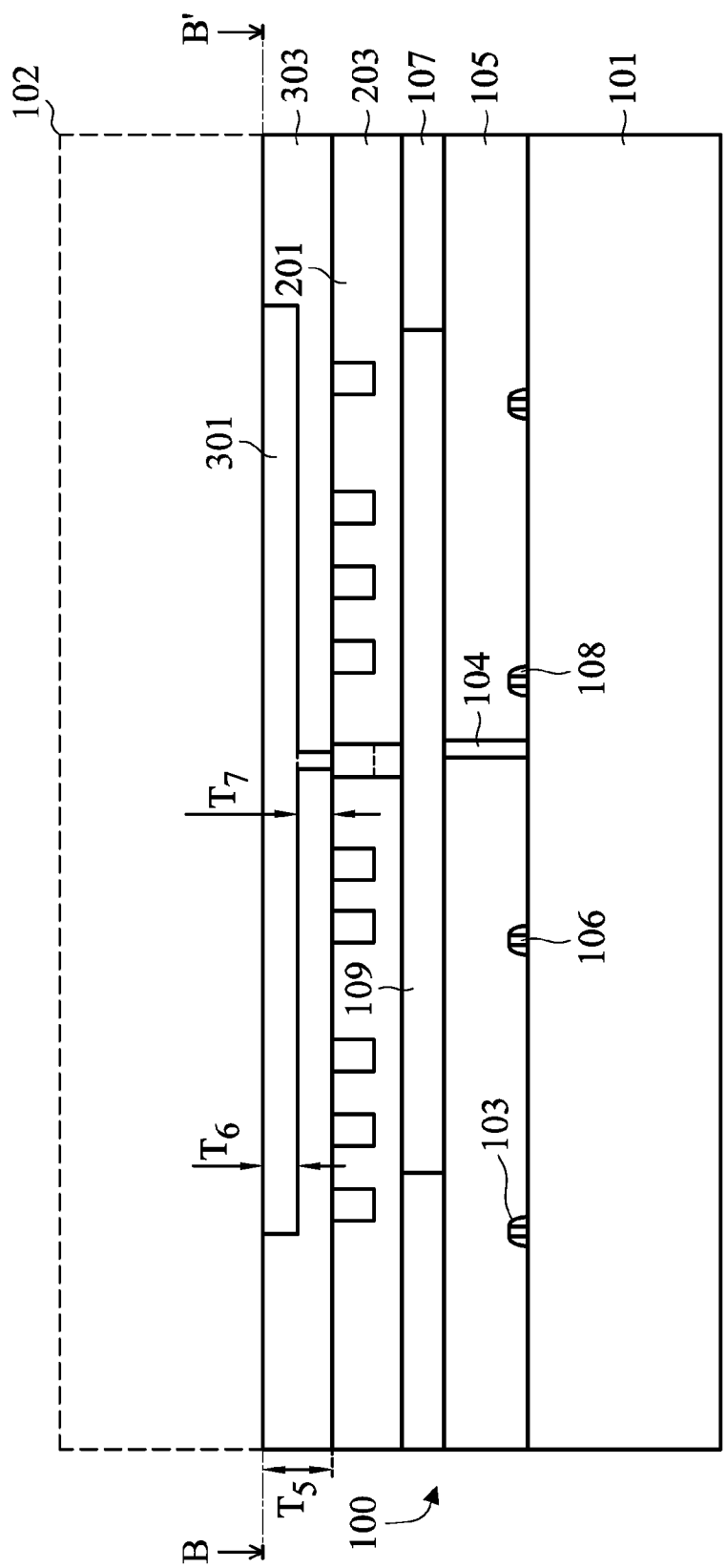
FIGS. 3A-3B illustrate a formation of a third metal layer in accordance with some embodiments.
Figure 3B:
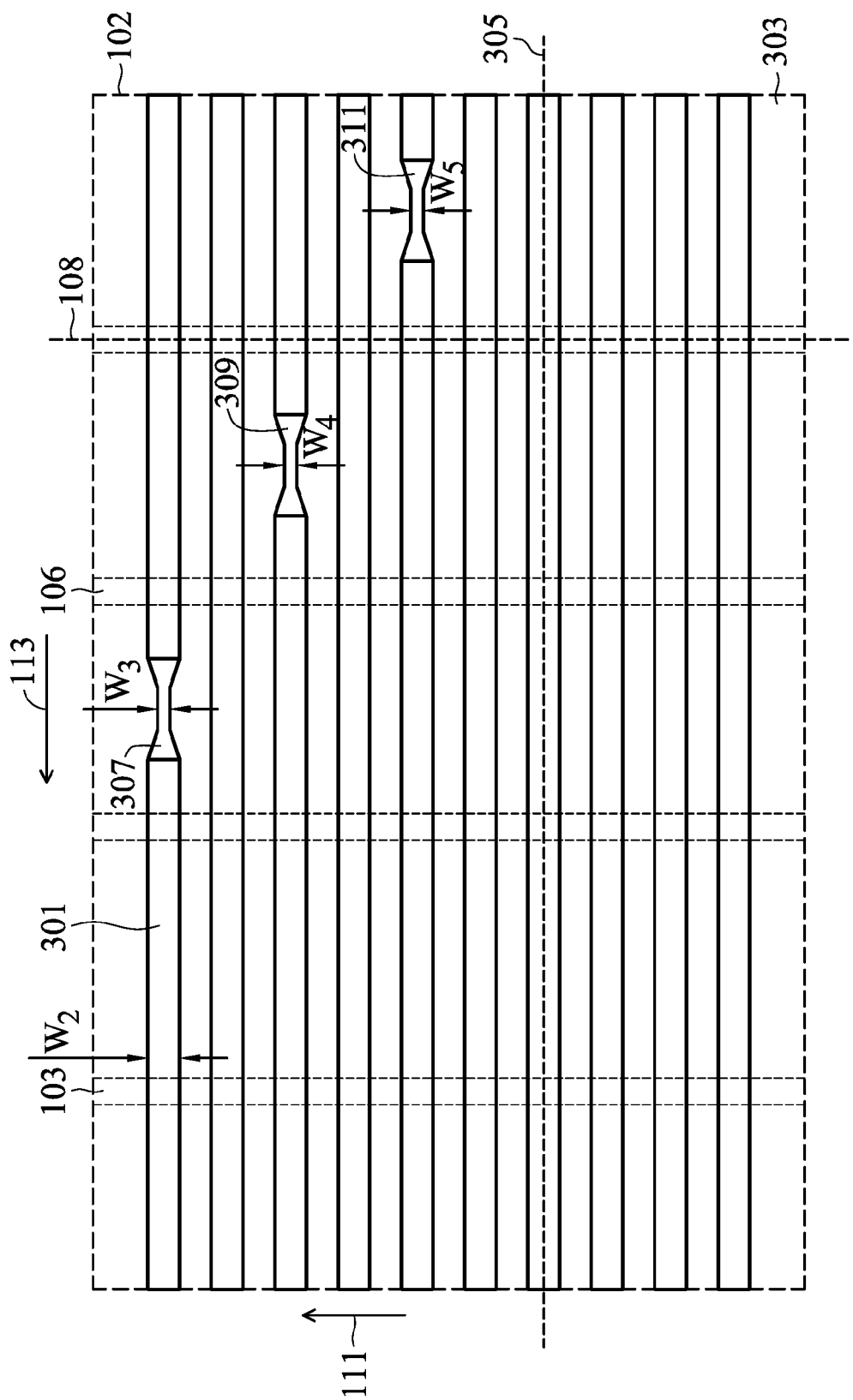

FIGS. 3A-3B illustrate a formation of a third metal layer 301 (M3) and a third dielectric layer 303 over the second metal layer 201, with FIG. 3B illustrating a top down view of FIG. 3A along line B-B'. In an embodiment the third dielectric layer 303 may be formed using similar methods and materials as described above with respect to the second dielectric layer 203. For example, the third dielectric layer 303 may be a low-k dielectric material formed using a spin on process. However, any suitable process may be utilized to form the third dielectric layer 303. The third dielectric layer 303 may be formed to a fifth thickness $T_5$ of between about 800 Å and about 1400 Å, such as about 1100 Å.

Once the third dielectric layer 303 has been formed, the third metal layer 301 may be formed within the third dielectric layer 303. In an embodiment the third metal layer 301 may be formed using similar processes and similar materials as described above with respect to the second metal layer 201. For example, a dual damascene, two step process may be used to initially form a first opening into the third dielectric layer 303 and then extend the first opening through the third dielectric layer 303 to form a lower via opening while at the same time forming a second opening into, but not through, the third dielectric layer 303 for an upper trench opening. Once the openings have been formed, a conductive material such as copper may be deposited to fill and/or overfill the openings, and any excess conductive material may be removed from outside of the openings using a planarization process. However, any suitable method of manufacturing may be utilized to form the third metal layer 301.

In an embodiment the upper trench portions of the third metal layer 301 have a sixth thickness $T_6$ that is less than the fourth thickness $T_4$ (of the second metal layer 201), such as by being between about 400 Å and about 1000 Å, such as about 600 Å. Additionally, the lower via portions of the third metal layer 301 may be formed to have a seventh thickness $T_7$ of between about 400 Å and about 800 Å, such as about 500 Å. However, any suitable thicknesses may be utilized.

By forming the upper trench portions of the third metal layer 301 to have the sixth thickness $T_6$ that is less than the fourth thickness $T_4$, the overall resistance that is encountered during programming of the fuses may be reduced. In particular, in an embodiment in which the second metal layer 201 is thicker than the third metal layer 301, the lower resistance of the second metal layer 201 leads to an increase in the fuse connection current that may be supplied by the connections of the second metal layer 201 to the fuses within the third metal layer 301 (e.g., the first fuse 307, the second fuse 309, and the third fuse 311).

FIG. 3B, which illustrates a top down view of the structure of FIG. 3A, illustrates that, within the first area 102 of the third metal layer 301, the individual lines have third longitudinal axes (represented in FIG. 2B by the dashed line labeled 305) that are all parallel with each other. Additionally, the third longitudinal axes 305 are also aligned in the second direction 113. As such, the third metal layer 301 is aligned with the first metal layer 109 and is also aligned perpendicular with the gate electrodes 106 of the active devices 103 as well as aligned perpendicular with the second metal layer 201 and the gate electrodes 106 of the active devices 103. By forming the third longitudinal axes 305 to be perpendicular with the gate electrodes, the structure is lithography friendly.

FIG. 3B additionally illustrates a formation of fuses (e.g., a first fuse 307, a second fuse 309, and a third fuse 311) within the third metal layer 301. In an embodiment the first fuse 307, the second fuse 309 and the third fuse 311 are formed within the third metal layer 301 by adjusting the thickness of portions of the individual lines of the third metal layer 301 using, e.g., the masking and etching processes during the formation of the openings for the third metal layer 301. For example, in one particular embodiment in which the individual lines of the third metal layer 301 within the first area 102 have a second width $W_2$ of between about 350 Å and about 550 Å, such as about 450 Å, the first fuse 307 may be formed to have a third width $W_3$ that is less than the second fuse 309 and the third fuse 311, such as by being between about 200 Å and about 400 Å, such as about 300 Å. Additionally, the second fuse 309 may be formed to have a fourth width $W_4$ that is larger than the first fuse 307 and less than the third fuse 311, such as by being between about 250 Å and about 450 Å, such as about 350 Å. Finally, the third fuse 311 may be formed to have a fifth width $W_5$ that is larger than both the first fuse 307 and the second fuse 309, such as by being between about 300 Å and about 500 Å, such as about 400 Å. However, any suitable dimensions may be utilized.

Additionally, while only three fuses are illustrated in FIG. 3B, these are intended to be representative and not limiting to the embodiments. Rather, any suitable number of fuses (greater than, equal to, or less than the number illustrated) may be utilized, and all such number are fully intended to be included within the scope of the embodiments.

By forming the fuses (e.g., the first fuse 307, the second fuse 309, and the third fuse 311) within the third metal layer 301 without additional routing and by forming the fuses not within the first metal layer 109, not within the second metal layer 201 (which has routing), or within the overlying metal layers (described further below) the first area 102 which contains the fuses may be reduced in size as the routing that may be needed in the second metal layer 201 (in addition to the fuses) may be removed. For example, the first area 102 may be reduced in size (in a top down view) to have an area between about 20000 µm² and about 120000 µm², such as about 60000 µm². By reducing the size of the first area 102 which comprises the fuses, the overall size of the semiconductor device 100 may be reduced as well.

Figure 4A:
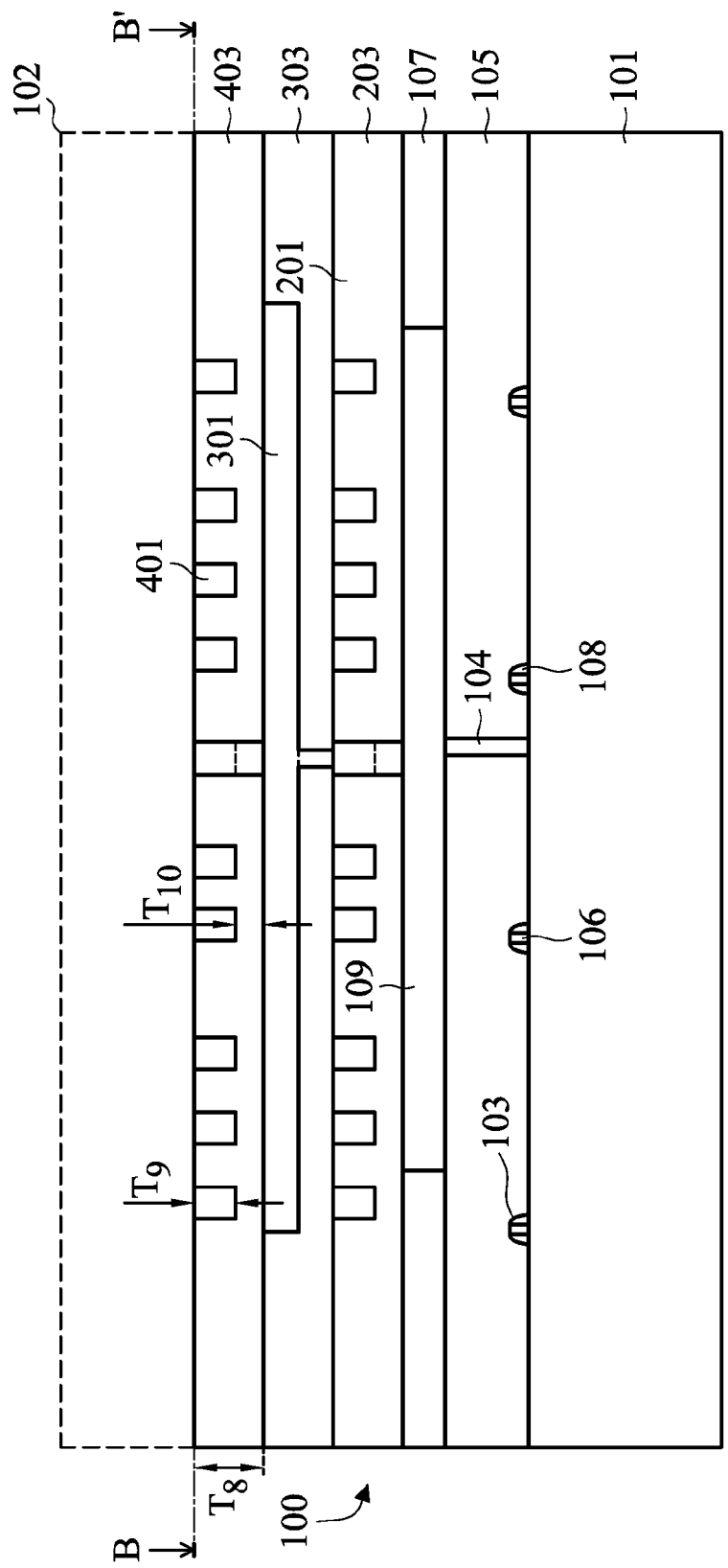
FIGS. 4A-4B illustrate a formation of a fourth metal layer in accordance with some embodiments.
Figure 4B:
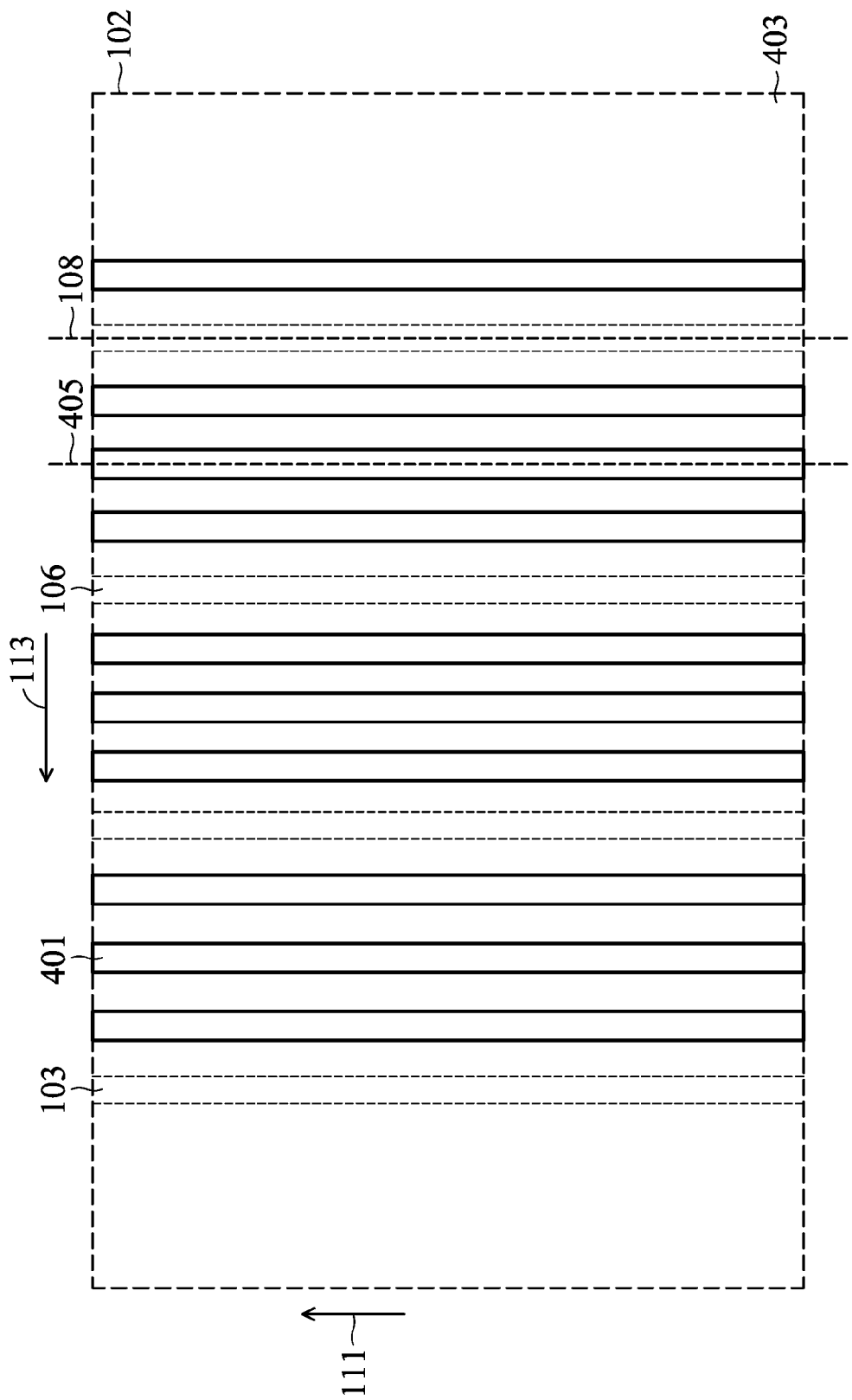

FIGS. 4A-4B illustrate a formation of a fourth metal layer 401 (M4) within a fourth dielectric layer 403. In an embodiment the fourth dielectric layer 403 may be formed using similar methods and materials as described above with respect to the second dielectric layer 203. For example, the fourth dielectric layer 403 may be a low-k dielectric material formed using a spin on process to an eighth thickness $T_8$ of between about 1000 Å and about 2000 Å, such as about 1300 Å. However, any suitable process and any suitable thickness may be utilized to form the fourth dielectric layer 403.

Once the fourth dielectric layer 403 has been formed, the fourth metal layer 401 may be formed within the fourth dielectric layer 403. In an embodiment the fourth metal layer 401 may be formed using similar processes and similar materials as described above with respect to the second metal layer 201. For example, a dual damascene, two-step process may be used to initially form a first opening for a lower via portion into the fourth dielectric layer 403 and then extend the first opening through the fourth dielectric layer 403 while at the same time forming a second opening into, but not through, the fourth dielectric layer 403 for an upper trench portion of the fourth metal layer 401. Once the openings have been formed, a conductive material such as copper may be deposited to fill and/or overfill the openings, and any excess conductive material may be removed from outside of the openings using a planarization process. However, any suitable method of manufacturing may be utilized to form the fourth metal layer 401.

In an embodiment the upper trench portion of the fourth metal layer 401 may be formed to have a ninth thickness $T_9$ of between about 600 Å and about 1200 Å, such as about 800 Å. Additionally, the lower via portion may have a tenth thickness $T_{10}$ of between about 400 Å and about 800 Å, such as about 500 Å. However, any suitable thickness may be utilized to form the upper trench portion of the fourth metal layer 401 and the lower via portion of the fourth metal layer 401.

FIG. 4B, which illustrates a top-down view of the structure of FIG. 4A along line B-B' (with the active devices 103 additionally illustrated by dashed lines for convenience), illustrates that, within the fourth metal layer 401, the individual lines of the fourth metal layer 401 (e.g., the upper trench portions of the fourth metal layer 401) have fifth longitudinal axes (represented in FIG. 4B by the dashed line labeled 405) that are aligned with each other. Further, the fifth longitudinal axes 405 are also aligned in the first direction 111. As such, the fourth metal layer 401 is aligned parallel with the second metal layer 201 as well as the gate electrodes 106 of the active devices 103. Additionally, the fourth metal layer 401 is perpendicular with the third metal layer 301 and the first metal layer 109.

Figure 5A:
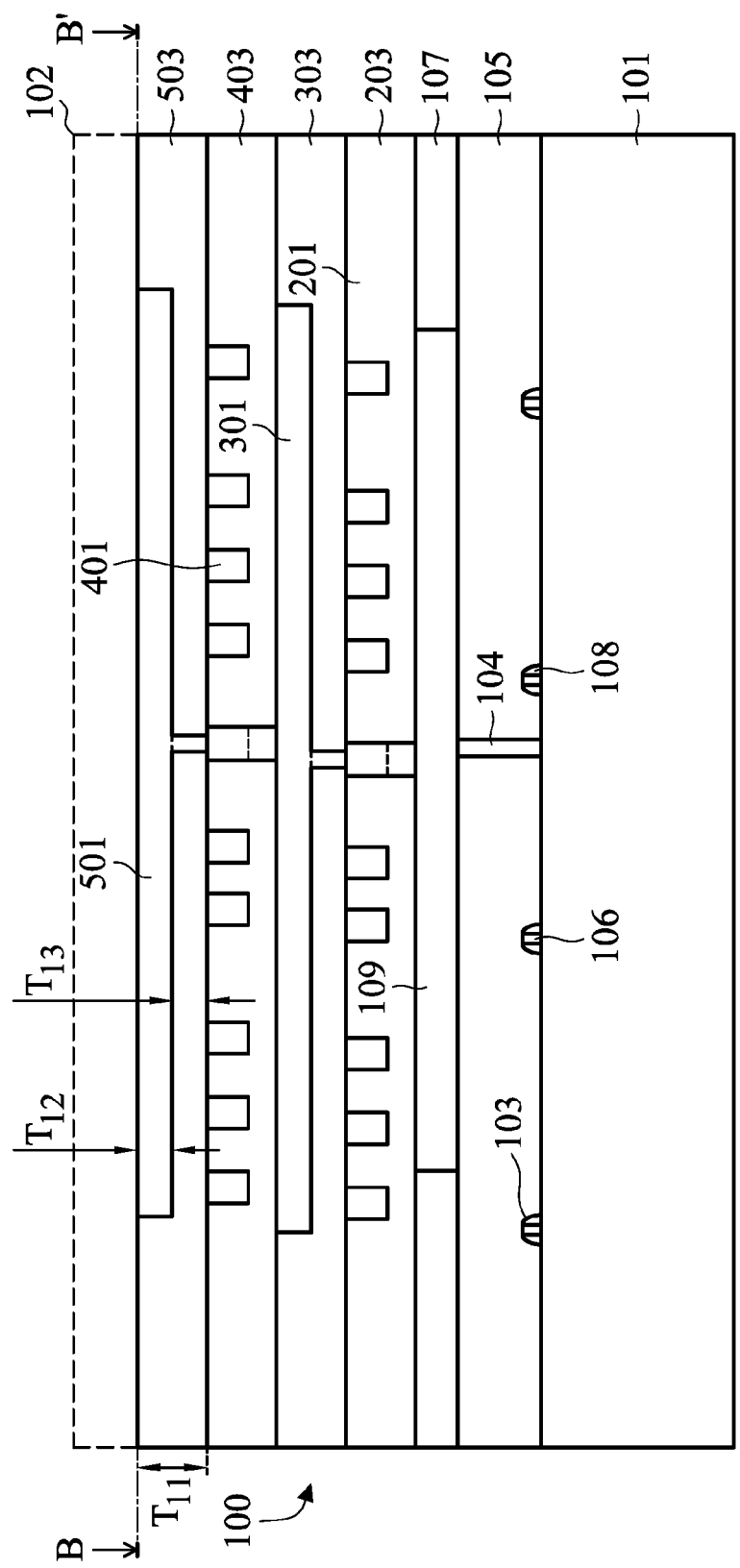
FIGS. 5A-5B illustrate a formation of a fifth metal layer in accordance with some embodiments.
Figure 5B:
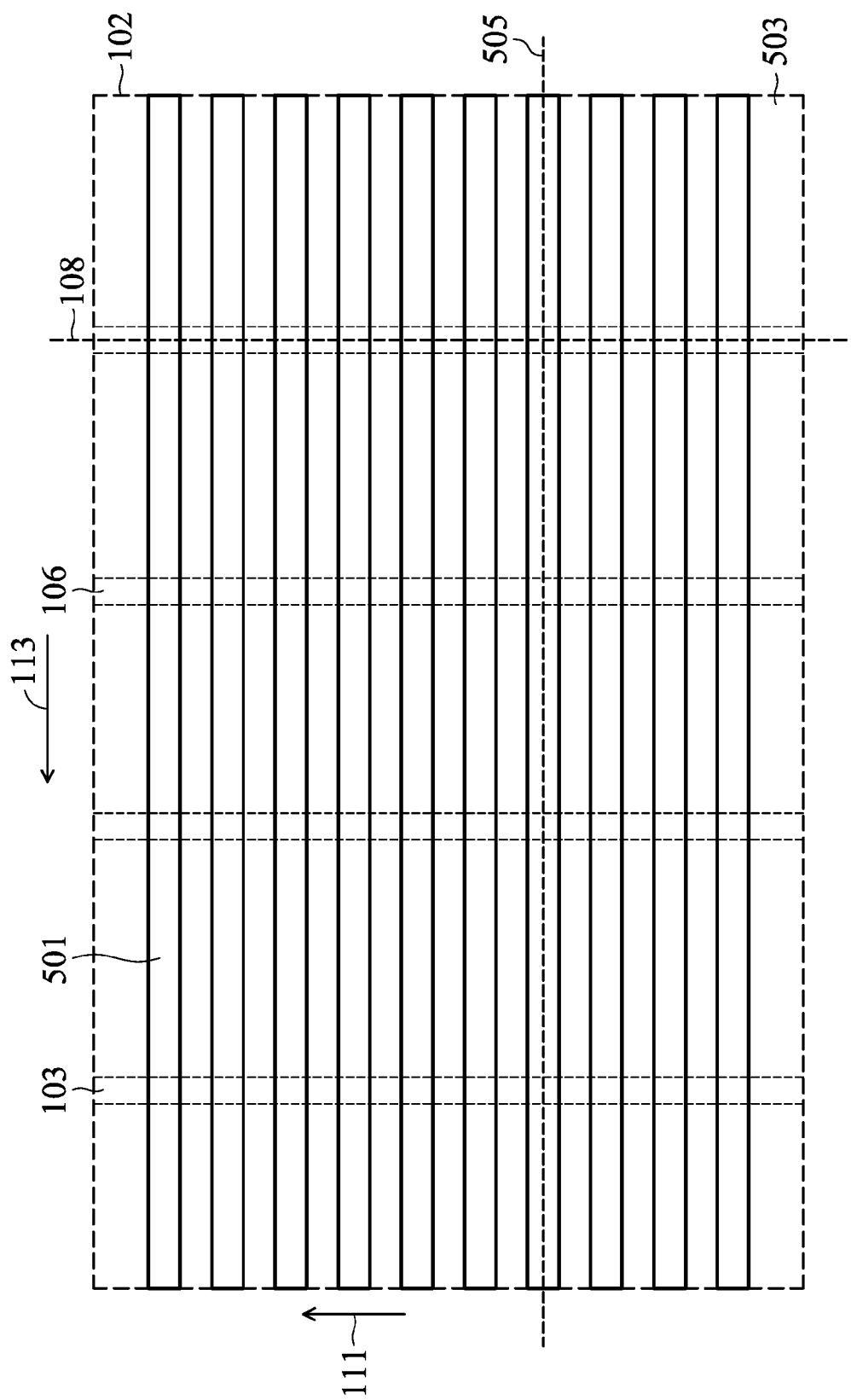

FIGS. 5A-5B illustrate a formation of a fifth metal layer 501 (M5) within a fifth dielectric layer 503, with FIG. 5B illustrating a top down view of FIG. 5A along line B-B'. In an embodiment the fifth dielectric layer 503 may be formed using similar methods and materials as described above with respect to the second dielectric layer 203. For example, the fifth dielectric layer 503 may be a low-k dielectric material formed using a spin on process to an eleventh thickness $T_{11}$ of between about 2000 Å and about 4000 Å, such as about 3000 Å. However, any suitable process may be utilized to form the fifth dielectric layer 503.

Once the fifth dielectric layer 503 has been formed, the fifth metal layer 501 may be formed within the fifth dielectric layer 503. In an embodiment the fifth metal layer 501 may be formed using similar processes and similar materials as described above with respect to the second metal layer 201. For example, a dual damascene, two step process may be used to initially form a first opening into the fifth dielectric layer 503 for the lower via portion of the fifth metal layer 501 and then extend the first opening through the fifth dielectric layer 503 while at the same time forming a second opening into, but not through, the fifth dielectric layer 503 for the upper trench portion of the fifth metal layer 501. Once the openings have been formed, a conductive material such as copper may be deposited to fill and/or overfill the openings, and any excess conductive material may be removed from outside of the openings using a planarization process. However, any suitable method of manufacturing may be utilized to form the fifth metal layer 501.

FIG. 5B, which illustrates a top-down view of the structure of FIG. 5A (with the active devices 103 additionally illustrated by dashed lines for convenience), illustrates that, within the first area 102 of the fifth metal layer 501, the individual lines of the fifth metal layer 501 (e.g., the upper trench portions of the fifth metal layer 501) have sixth longitudinal axes (represented in FIG. 5B by the dashed line labeled 505) that are aligned with each other. Further, the sixth longitudinal axes 505 are also aligned in the second direction 113. As such, the fifth metal layer 501 is aligned perpendicular with the second metal layer 201 as well as the gate electrodes 106 of the active devices 103. Additionally, the fifth metal layer 501 is parallel with the third metal layer 301 and the first metal layer 109.

Once the fifth metal layer 501 has been formed, the semiconductor device 100 may be completed by forming contact pads, passivation layers, and external connectors that can connect the semiconductor device 100 to outside devices (all of which are not separately illustrated in the Figures), as well as the semiconductor device 100 being singulated from a wafer on which it was formed. Additionally, any suitable additional structures, packages, or other external devices may be utilized and connected to the semiconductor device 100 to prepare the semiconductor device 100 for eventual consumer usage.

Additionally, once the semiconductor device 100 is ready to be utilized, the semiconductor device 100 may be programmed in order to blow certain ones of the fuses (e.g., the first fuse 307, the second fuse 309, and the third fuse 311) in order to program the semiconductor device 100. In an embodiment the first fuse 307, the second fuse 309, and the third fuse 311 may be sequentially blown using, e.g., an EFUSE process, although any suitable process may be utilized. For example, in an embodiment in which an EFUSE process is utilized, a voltage is applied to the third metal layer 301 (through, e.g., the second metal layer 201) of between about 1.6 V and about 2.0 V, such as about 1.8 V, for a period of time between about 2 μs and about 10 μs, such as about 6 μs. This voltage, when applied to the third metal layer 301 with the dimensions as described above, will sequentially blow the first fuse 307 (with the smallest width), then blow the second fuse 309 (with the middle width) and then, finally, blow the third fuse 311. As such, by controlling the voltage as well as the amount of time that the programming current is applied to the fuses, a controlled programming process that will sequentially blow the fuses may be used to blow one fuse (e.g., the first fuse 307), two of the fuses (e.g., the first fuse 307 and the second fuse 309), or all three of the fuses (e.g., the first fuse 307, the second fuse 309, and the third fuse 311). As such, the semiconductor device 100 may be programmed as desired.

However, by manufacturing the metal layers and the fuses as described herein, the overall programming current that is used to program the fuses within the third metal layer 301 may be increased because of the reduction in resistance through the increased thickness of the second metal layer 201, which supplies the programming current to the third metal layer 301. As such, the programming current applied to the third metal layer 301 may be between about 20 μA and about 100 μA, such as about 60 μA. However, any suitable programming current may be applied.

In accordance with an embodiment, a method of manufacturing a semiconductor device comprising forming a plurality of gate electrodes over a first region of a semiconductor substrate, the plurality of gate electrodes extending in a first direction is provided. A first metal layer is formed over the plurality of gate electrodes in the first region, wherein each individual line in the first metal layer within the first region extends in a second direction perpendicular with the first direction, wherein the first metal layer is free from fuses. A second metal layer is formed over the first metal layer in the first region, wherein each individual line in the second metal layer within the first region extends in the first direction, wherein the second metal layer is free from fuses. A third metal layer is formed over the second metal layer in the first region, wherein each individual line in the third metal layer within the first region extends in the second direction, wherein the third metal layer comprises fuses.

In accordance with another embodiment, a method of manufacturing a semiconductor device comprising forming a series of active devices on a semiconductor substrate is provided. A first metal layer is deposited over the series of active devices, the first metal layer being arranged perpendicular to the series of active devices in a top down view. A second metal layer is deposited over the first metal layer, the second metal layer being arranged perpendicular to the first metal layer in the top down view, and a series of fuses is deposited within a third metal layer over the second metal layer, the third metal layer being arranged perpendicular to the second metal layer in the top down view.

In accordance with yet another embodiment, a semiconductor device comprising a plurality of active devices in a first area of a semiconductor substrate, the plurality of active devices extending in a first direction is provided. A first metal layer is over the plurality of active device, the first metal layer comprising a first plurality of metal lines in the first area arranged in a second direction perpendicular to the first direction, and a second metal layer is over the first metal layer, the second metal layer comprising a second plurality of metal lines in the first area arranged in the first direction. A third metal layer is over the second metal layer, the third metal layer comprising a third plurality of metal lines and a plurality of fuses, wherein the third plurality of metal lines are arranged in the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a plurality of gate electrodes over a first region of a semiconductor substrate, the plurality of gate electrodes extending in a first direction;
   a first metal layer over the plurality of gate electrodes in the first region;
   a second metal layer over the first metal layer in the first region; and
   a third metal layer over the second metal layer in the first region, wherein each individual line in the third metal layer within the first region extends in a second direction perpendicular with the first direction, wherein the third metal layer comprises fuses.

2. The semiconductor device of claim 1, wherein each individual line in the first metal layer within the first region extends in a second direction perpendicular with the first direction, wherein the first metal layer is free from fuses.

3. The semiconductor device of claim 2, wherein each individual line in the second metal layer within the first region extends in the first direction, wherein the second metal layer is free from fuses.

4. The semiconductor device of claim 1, further comprising a fourth metal layer over the third metal layer in the first region, wherein each individual line in the fourth metal layer within the first region extends in the first direction.

5. The semiconductor device of claim 4, further comprising a fifth metal layer over the fourth metal layer in the first region, wherein each individual line in the fifth metal layer within the first region extends in the second direction.

6. The semiconductor device of claim 1, wherein the second metal layer has a first thickness and wherein the third metal layer has a second thickness different from the first thickness.

7. The semiconductor device of claim 6, wherein the second thickness is less than the first thickness.

8. A semiconductor device comprising:
a series of active devices on a semiconductor substrate;
a first metal layer over the series of active devices;
a second metal layer over the first metal layer; and
a series of fuses within a third metal layer over the second metal layer, the third metal layer being arranged perpendicular to the series of active devices in a top down view.

9. The semiconductor device of claim 8, wherein the first metal layer is arranged perpendicular to the series of active devices in a top down view.

10. The semiconductor device of claim 9, wherein the second metal layer is arranged perpendicular to the first metal layer in the top down view.

11. The semiconductor device of claim 8, wherein the series of fuses has a first thickness and wherein the second metal layer has a second thickness different from the first thickness.

12. The semiconductor device of claim 11, wherein the first thickness is less than the second thickness.

13. The semiconductor device of claim 8, further comprising a fourth metal layer over the third metal layer, the fourth metal layer being arranged perpendicular to the third metal layer in the top down view.

14. The semiconductor device of claim 8, further comprising a fifth metal layer over the fourth metal layer, the fifth metal layer being arranged perpendicular to the fourth metal layer in the top down view.

15. A method of manufacturing a semiconductor device comprising:
forming a plurality of active devices in a first area of a semiconductor substrate, the plurality of active devices extending in a first direction;
depositing a first metal layer over the plurality of active device;
depositing a second metal layer over the first metal layer; and
forming a third metal layer over the second metal layer, the third metal layer comprising a third plurality of metal lines and a plurality of fuses, wherein the third plurality of metal lines are arranged in a second direction perpendicular to the first direction.

16. The method of claim 15, wherein the first metal layer comprising a first plurality of metal lines in the first area arranged in the second direction.

17. The method of claim 16, wherein the second metal layer comprises a second plurality of metal lines in the first area arranged in the first direction.

18. The method of claim 17, further comprising forming a fourth metal layer over the third metal layer, the fourth metal layer comprising a fourth plurality of metal lines arranged in the first direction.

19. The method of claim 15, wherein the third plurality of metal lines has a first thickness, the second metal layer has a second thickness, and the first thickness is less than the second thickness.

20. The method of claim 15, wherein the first metal layer and the second metal layer are the only metallization layers between the active devices and the third metal layer.

* * * * *